(12) United States Patent
Kim et al.

(10) Patent No.: US 11,579,346 B2
(45) Date of Patent: Feb. 14, 2023

(54) COLOR FILTER AND IMAGE DISPLAY DEVICE

(71) Applicant: DONGWOO FINE-CHEM CO., LTD., Iksan-si (KR)

(72) Inventors: Hyung Joo Kim, Pyeongtaek-si (KR); Juho Kim, Pyeongtaek-si (KR); Hyunjung Wang, Seoul (KR); Jong Soo Lee, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 768 days.

(21) Appl. No.: 16/483,622

(22) PCT Filed: Feb. 7, 2018

(86) PCT No.: PCT/KR2018/001659
§ 371 (c)(1),
(2) Date: Aug. 5, 2019

(87) PCT Pub. No.: WO2018/151457
PCT Pub. Date: Aug. 23, 2018

(65) Prior Publication Data
US 2020/0033516 A1    Jan. 30, 2020

(30) Foreign Application Priority Data

Feb. 14, 2017   (KR) .................. 10-2017-0020085

(51) Int. Cl.
*G02B 5/20* (2006.01)
*G03F 7/00* (2006.01)
(Continued)

(52) U.S. Cl.
CPC .............. *G02B 5/207* (2013.01); *C09K 11/56* (2013.01); *C09K 11/88* (2013.01); *G03F 7/0007* (2013.01)

(58) Field of Classification Search
CPC .......................... G02B 5/207; G03F 7/0007
See application file for complete search history.

(56) References Cited

U.S. PATENT DOCUMENTS

| 2008/0036367 A1* | 2/2008 | Eida ...................... H01L 27/322 313/504 |
| 2016/0091758 A1* | 3/2016 | Yoneyama ........ G02F 1/133603 349/71 |
| 2016/0223732 A1* | 8/2016 | Jeon .......................... G02F 2/02 |

FOREIGN PATENT DOCUMENTS

| CN | 101305643 A | 11/2008 |
| CN | 105911820 A | 8/2016 |

(Continued)

OTHER PUBLICATIONS

International Search Report for PCT/KR2018/001659 dated Jun. 12, 2018 [PCT/ISA/210].

*Primary Examiner* — Matthew E. Hoban
(74) *Attorney, Agent, or Firm* — Sughrue Mion, PLLC (57) ABSTRACT

Disclosed are a color filter including a wavelength conversion layer which converts the wavelength of light, a light transmission layer formed on the wavelength conversion layer, and a wavelength filter layer formed on the light transmission layer, and an image display device. The light transmission layer transmits a light moving between the wavelength conversion layer and the wavelength filter layer and blocks the flow of outgas. The color filter includes the light transmission layer which transmits a light moving between the wavelength conversion layer and the wavelength filter layer and blocks the flow of outgas, thereby capable of achieving high color reproductivity while having excellent light-emitting efficiency and light retention rate.

8 Claims, 1 Drawing Sheet

(51) Int. Cl.
*C09K 11/56* (2006.01)
*C09K 11/88* (2006.01)

(56) References Cited

FOREIGN PATENT DOCUMENTS

| | | |
|---|---|---|
| JP | 2004-319471 A | 11/2004 |
| JP | 2006-123289 A | 5/2006 |
| JP | 2009-164049 A | 7/2009 |
| JP | 2011-053339 A | 3/2011 |
| KR | 10-0432291 B1 | 5/2004 |
| KR | 10-0745343 B1 | 8/2007 |
| KR | 2009-36373 A | 4/2009 |
| KR | 10-2016-0112499 A | 9/2016 |
| KR | 2016-0117091 A | 10/2016 |
| KR | 10-2016-0140717 A | 12/2016 |
| TW | 201140240 A | 11/2011 |
| WO | 2007/055287 A1 | 5/2007 |
| WO | 2016/098570 A1 | 6/2016 |
| WO | 2016/129419 A1 | 8/2016 |

* cited by examiner

COLOR FILTER AND IMAGE DISPLAY DEVICE

CROSS REFERENCE TO RELATED APPLICATIONS

This is a National Stage of International Application No. PCT/KR2018/001659 filed Feb. 7, 2018, claiming priority based on Korean Patent Application No. 10-2017-0020085 filed Feb. 14, 2017, the contents of all of which are incorporated herein by reference in their entirety.

TECHNICAL FIELD

The present invention relates to a color filter and an image display device. More specifically, the present invention relates to a color filter comprising a light transmission layer between a wavelength conversion layer and a wavelength filter layer, thereby capable of achieving high color reproductivity while having excellent light-emitting efficiency and light retention rate, and an image display device having the color filter.

BACKGROUND ART

Recently, as one of the methods for achieving a color filter, a pigment dispersion method using a pigment dispersion type photosensitive resin is applied. However, in a process where light irradiated from a light source is transmitted through a color filter, there arise problems that a part of the light is absorbed by the color filter, resulting in the deterioration of light efficiency, and the color reproduction decreases due to the properties of the pigment contained in the color filter.

As an alternative to resolve these problems, there has been proposed a color filter using a photosensitive resin composition containing a quantum dot. For example, Korean Patent Laid-Open Publication No. 2009-0036373 discloses that when a conventional color filter is replaced by a light-emitting layer consisting of quantum dot phosphors, it can improve a light-emitting efficiency, thereby improving a display quality.

As such, when the quantum dots are used as light-emitting materials for a color filter, a light emission waveform can be narrowed, and also it can have high color reproduction capacity which cannot be achieved in a pigment and have excellent brightness properties. However, an image display device having a quantum dot color filter uses a blue light as a light source, and the blue light used herein is mixed with a self-emission light of red, green and blue pixel layers. Thus, there is no problem in the case of the blue pixel layer, but pure red and green may not be easily emitted in the case of the red and green pixel layers. For example, in the case of the green pixel layer, a light emission peak appears at 500 to 550 nm by the quantum dots, but when a blue light is used, a peak appears at 380 to 400 nm simultaneously by the blue light, resulting in the deterioration of color purity of a color filter. Therefore, there is a disadvantage in that the image quality is deteriorated due to the limitation in displaying a desired color in a reproductive way.

In addition, the quantum dots are influenced by a post-bake process carried out at high temperature for the production of a color filter, resulting in the deterioration of light-emitting efficiency and light retention rate. Thus, there is a need to develop a method capable of inhibiting the occurrence of such a problem.

DISCLOSURE

Technical Problem

It is one object of the present invention to provide a color filter capable of achieving high color reproductivity while having excellent light-emitting efficiency and light retention rate.

It is another object of the present invention to provide an image display device having the color filter.

Technical Solution

In accordance with one aspect of the present invention, there is provided a color filter comprising a wavelength conversion layer which converts the wavelength of light, a light transmission layer formed on the wavelength conversion layer, and a wavelength filter layer formed on the light transmission layer, wherein the light transmission layer transmits a light moving between the wavelength conversion layer and the wavelength filter layer and blocks the flow of outgas.

In one embodiment of the present invention, the wavelength conversion layer may include a self-emission type pixel layer containing quantum dots.

In one embodiment of the present invention, the light transmission layer may be a cured layer of a thermosetting or photocurable resin composition.

In one embodiment of the present invention, the wavelength filter layer may be a cured layer of a colored photosensitive resin composition.

In accordance with another aspect of the present invention, there is provided an image display device having the color filter.

Advantageous Effects

The color filter according to the present invention comprises the light transmission layer which transmits a light moving between the wavelength conversion layer and the wavelength filter layer and blocks the flow of outgas, thereby capable of achieving high color reproductivity while having excellent light-emitting efficiency and light retention rate.

DETAILED DESCRIPTION OF THE EMBODIMENTS

Hereinafter, the present invention will be described in more detail with reference to the accompanying drawings.

Figure 1:
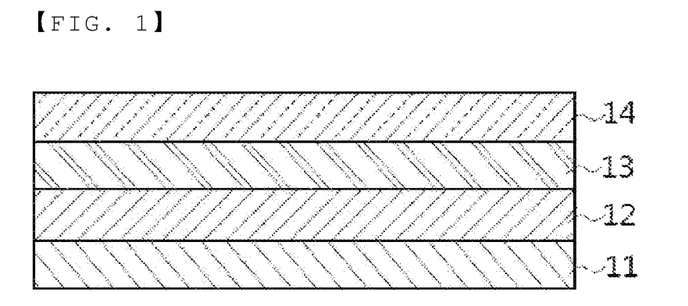
FIG. 1 is a cross-sectional view of the color filter according to one embodiment of the present invention.

Referring to FIG. 1, the color filter according to the present invention comprises a substrate 11, a wavelength conversion layer 12 formed on the substrate 11 and converting the wavelength of light, a light transmission layer 13 formed on the wavelength conversion layer and a wavelength filter layer 14 formed on the light transmission layer.

Figure 2:
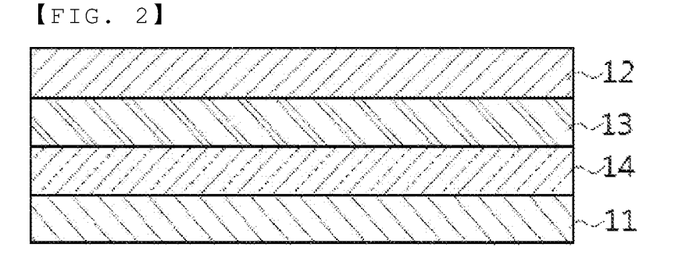
FIG. 2 is a cross-sectional view of the color filter according to another embodiment of the present invention.

Further, referring to FIG. 2, the color filter according to another embodiment of the present invention comprises a substrate 11, a wavelength filter layer 14 formed on the substrate 11, a light transmission layer 13 formed on the wavelength filter layer and a wavelength conversion layer 12 formed on the light transmission layer and converting the wavelength of light.

Herein, the light source can be positioned on the lower part of the substrate 11.

<Substrate>

In one embodiment of the present invention, the substrate may be a substrate of the color filter itself, or a part where the color filter is positioned on a display device or the like, and is not particularly limited.

The substrate may be a glass, silicon (Si), silicon oxide ($SiO_x$), or polymer substrate. The polymer substrate may be polyethersulfone (PES) substrate or polycarbonate (PC) substrate, etc.

<Wavelength Conversion Layer>

In one embodiment of the present invention, the wavelength conversion layer may include a self-emission type pixel layer containing quantum dots.

The wavelength conversion layer may have a thickness of 1.0 to 15.0 μm, preferably 3.0 to 12 μm, and more preferably 4.0 to 10 μm.

Specifically, the self-emission type pixel layer may be a cured layer of a self-emission type photosensitive resin composition comprising a photoluminescence quantum dot particle, an alkali-soluble resin, a photopolymerizable compound, a photopolymerization initiator and a solvent.

The quantum dots are nano-sized semiconductor materials. Atoms form molecules, and the molecules form an aggregate of small molecules called a cluster, thereby forming nanoparticles. When these nanoparticles have particularly semiconductor properties, they are referred to as quantum dots. When the quantum dots receive energy from the outside and reach an excited state, they emit energy corresponding to the unique energy bandgap.

The color filter of the present invention includes these photoluminescence quantum dot particles, and thus a color filter produced therefrom enables light emitting (photoluminescence) by light irradiation.

The quantum dots according to the present invention are not particularly limited as long as they are quantum dots capable of emitting light by stimulation of light. For example, they can be selected from the group consisting of Group II-VI semiconductor compounds; Group III-V semiconductor compounds; Group IV-VI semiconductor compounds; a Group IV element or a compound containing the same; and a combination thereof. They may be used alone or in combination of two or more thereof.

The Group II-VI semiconductor compounds may be selected from the group consisting of a binary compound selected from the group consisting of CdS, CdSe, CdTe, ZnS, ZnSe, ZnTe, ZnO, HgS, HgSe, HgTe, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof, but are not limited thereto. The Group III-V semiconductor compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but are not limited thereto. The Group IV-VI semiconductor compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof, but are not limited thereto. The Group IV element or a compound including the same may be selected from the group consisting of an element selected from the group consisting of Si, Ge, and a mixture thereof; and a binary compound selected from the group consisting of SiC, SiGe, and a mixture thereof, but is not limited thereto.

Further, the quantum dots may have a homogeneous single structure; a double structure, such as core-shell, gradient structure and the like; or a mixed structure thereof.

In the double structure of core-shell, materials constituting each of the core and shell may be composed of mutually different semiconductor compounds described above. For example, the core may include at least one material selected from the group consisting of CdSe, CdS, ZnS, ZnSe, CdTe, CdSeTe, CdZnS, PbSe, AgInZnS and ZnO, but is not limited thereto. The shell may include at least one material selected from the group consisting of CdSe, ZnSe, ZnS, ZnTe, CdTe, PbS, TiO, SrSe and HgSe, but is not limited thereto.

Similarly to the case where a colored photosensitive resin composition used in the production of a conventional color filter contains red, green and blue coloring agents for representing color, the quantum dots used in the production of the color filter of the present invention also contain quantum dots representing red color, quantum dots representing green color and quantum dots representing blue color, and they may be any one selected from the aforementioned red color, green color, blue color and a combination thereof.

The quantum dots can be synthesized by a wet chemical process, a metal organic chemical vapor deposition, or a molecular beam epitaxy.

The wet chemical process is a method of growing particles by adding a precursor material into an organic solvent. When crystals are grown, the organic solvent naturally coordinates to the surface of the quantum dot crystals and acts as a dispersing agent, thereby controlling the growth of the crystals. Thus, the growth of nanoparticles can be controlled through an easier and less expensive process compared to a vapor deposition method, such as the metal organic chemical vapor deposition (MOCVD) or the molecular beam epitaxy (MBE).

The content of the photoluminescence quantum dot particles is not particularly limited, and may be, for example, 3 to 80% by weight, particularly 5 to 70% by weight based on 100% by weight of the total solid content of the self-emission type photosensitive resin composition. When the content of the photoluminescence quantum dot particles is less than 3% by weight, the light-emitting efficiency may be insufficient. When the content exceeds 80% by weight, the content of other components may be relatively insufficient, making it difficult to form a pixel pattern.

The alkali-soluble resin has reactivity caused by the action of heat and alkali solubility, acts as a dispersion medium for solids including a coloring agent, and functions as a binder resin. Thus, any alkali-soluble resin can be used as long as it is a binder resin soluble in an alkali developing solution used in a developing step of the production process of a film using a resin composition.

As the alkali-soluble resin, those having an acid value of 10 to 200 KOHmg/g can be selected and used. The "acid value" means a value measured as the amount of potassium hydroxide (mg) required to neutralize 1 g of polymer, and is involved in solubility. When the acid value of the alkali-soluble resin is below the above range, it may be difficult to secure sufficient developing velocity. In contrast, when the acid value of the alkali-soluble resin exceeds the above range, problems may arise that the adhesion to a substrate is reduced, so that a short circuit of the pattern is liable to occur, and the storage stability of the entire composition is reduced, thereby increasing viscosity.

In addition, the alkali-soluble resin may be directly polymerized such that it has a weight average molecular weight of 3,000 to 200,000 Da, preferably 5,000 to 100,000 Da, and a molecular weight distribution of 1.5 to 6.0, preferably 1.8 to 4.0, or may be purchased and used. When the alkali-soluble resin having the molecular weight and molecular weight distribution within the above ranges is used, hardness can be enhanced, and it can have high solubility of a non light-exposed part in a developing solution as well as a high residual film thickness, and can improve resolution.

The alkali-soluble resin may be prepared by copolymerizing monomers having a carboxyl group and an unsaturated bond, and monomers having an unsaturated bond copolymerizable therewith.

Specific examples of the monomers having a carboxyl group and an unsaturated bond include monocarboxylic acids, such as acrylic acid, methacrylic acid, crotonic acid and the like; dicarboxylic acids, such as fumaric acid, mesaconic acid, itaconic acid and the like, and anhydrides thereof; and mono(meth)acrylates of a polymer having a carboxyl group and a hydroxyl group at both terminals thereof, such as ω-carboxypolycaprolactone mono(meth)acrylate and the like.

The copolymerizable monomers may be any one selected from the group consisting of an aromatic vinyl compound, an unsaturated carboxylic acid ester compound, an unsaturated carboxylic acid aminoalkyl ester compound, an unsaturated carboxylic acid glycidyl ester compound, a carboxylic acid vinyl ester compound, an unsaturated ether compound, a vinyl cyanide compound, an unsaturated amide compound, an unsaturated imide compound, an aliphatic conjugated diene compound, a macromonomer or bulk monomer having a monoacryloyl group or monomethacryloyl group at the terminal of the molecular chain, and a combination thereof.

Specifically, the copolymerizable monomers may include an aromatic vinyl compound, such as styrene, vinyl toluene, α-methylstyrene, p-chlorostyrene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether or p-vinylbenzyl glycidyl ether, etc.; alkyl (meth)acrylates, such as methyl(meth)acrylate, ethyl(meth)acrylate, n-propyl(meth)acrylate, i-propyl(meth)acrylate, n-butyl(meth)acrylate, i-butyl(meth)acrylate, sec-butyl (meth)acrylate or t-butyl(meth)acrylate, etc.; alicyclic(meth)acrylates, such as cyclopentyl(meth)acrylate, cyclohexyl (meth)acrylate, 2-methylcyclohexyl(meth)acrylate, tricyclo [5.2.1.0$^{2,6}$]decan-8-yl(meth)acrylate, 2-dicyclopentanyloxyethyl(meth)acrylate or isobornyl (meth)acrylate, etc.; aryl(meth)acrylates, such as phenyl (meth)acrylate or benzyl(meth)acrylate, etc.; hydroxyalkyl (meth)acrylates, such as 2-hydroxyethyl (meth)acrylate or 2-hydroxypropyl (meth)acrylate, etc.; an N-substituted maleimide-based compound, such as N-cyclohexylmaleimide, N-benzylmaleimide, N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide and the like; an unsaturated amide compound, such as (meth)acrylamide, N,N'-dimethyl (meth)acrylamide, and the like; and an unsaturated oxetane compound, such as 3-(methacryloyloxymethyl) oxetane, 3-(methacryloyloxymethyl)-3-ethyloxetane, 3-(methacryloyloxymethyl)-2-trifluoromethyloxetane, 3-(methacryloyloxymethyl)-2-phenyloxetane, 2-(methacryloyloxymethyl) oxetane or 2-(methacryloyloxymethyl)-4-trifluoromethyloxetane, etc.

Each of the monomers having a carboxyl group and an unsaturated bond and the monomers copolymerizable therewith may be used alone or in combination of two or more thereof.

The content of the alkali-soluble resin is not particularly limited and may be, for example, 2 to 80% by weight, preferably 10 to 70% by weight based on 100% by weight of the total solid content of the self-emission type photosensitive resin composition. When the content of the alkali-soluble resin is within the above range, a pattern layer can be easily formed, film reduction in the pixel part of the light-exposed part during development is prevented, thereby improving the dropout property of the non-pixel part.

The photopolymerizable compound is not particularly limited as long as it is a compound capable of polymerizing under the action of a photopolymerization initiator described later, and preferably include a monofunctional photopolymerizable compound, a bifunctional photopolymerizable compound, or a trifunctional or higher polyfunctional photopolymerizable compound, etc.

Specific examples of the monofunctional photopolymerizable compound include nonylphenylcarbitol acrylate, 2-hydroxy-3-phenoxypropyl acrylate, 2-ethylhexylcarbitol acrylate, 2-hydroxyethyl acrylate, N-vinylpyrrolidone and the like, and commercially available products thereof include Aronix M-101 (Toagosei Co., Ltd), KAYARAD TC-110S (Nippon Kayaku Co., Ltd) or Biscoat 158 (Osaka Yuki Kagaku Kogyo), etc.

Specific examples of the bifunctional photopolymerizable compound include 1,6-hexanediol di(meth)acrylate, ethyleneglycol di(meth)acrylate, neopentylglycol di(meth)acrylate, triethyleneglycol di(meth)acrylate, bis(acryloyloxyethyl) ether of bisphenol A, 3-methylpentanediol di(meth)acrylate and the like, and commercially available products thereof include Aronix M-210, M-1100, 1200 (Toagosei Co., Ltd), KAYARAD HDDA (Nippon Kayaku Co., Ltd), Biscoat 260 (Osaka Yuki Kagaku Kogyo), AH-600, AT-600 or UA-306H (Kyoeisha Kagaku), etc.

Specific examples of the trifunctional or higher polyfunctional photopolymerizable compound include trimethylolpropane tri(meth)acrylate, ethoxylated trimethylolpropane tri(meth)acrylate, propoxylated trimethylolpropane tri (meth)acrylate, pentaerythritol tri(meth)acrylate, pentaerythritol tetra(meth)acrylate, dipentaerythritol penta(meth)acrylate, ethoxylated dipentaerythritol hexa(meth)acrylate, propoxylated dipentaerythritol hexa(meth)acrylate, dipentaerythritol hexa(meth)acrylate, dipentaerythritol pentaacrylate succinic acid monoester and the like, and commercially available products thereof include Aronix M-309, TO-1382 (Toagosei Co., Ltd), KAYARAD TMPTA, KAYARAD DPHA or KAYARAD DPHA-40H (Nippon Kayaku Co., Ltd), etc.

Among the photopolymerizable compounds exemplified above, the trifunctional or higher polyfunctional photopolymerizable compounds are particularly preferred because they have superior polymerizability and can enhance strength.

These photopolymerizable compounds exemplified above may be used alone or in combination of two or more.

The content of the photopolymerizable compound may be preferably 5 to 70%; by weight, in particular, to 50% by weight based on 100% by weight of the total solid content of the self-emission type photosensitive resin composition. When the content of the photopolymerizable compound is within the above range, the strength or smoothness of the pixel part can be improved, and thus it is preferable.

The photopolymerization initiator can be used without particular limitation of its type as long as it is capable of polymerizing the photopolymerizable compound.

In particular, as the photopolymerization initiator, it is preferred to use at least one compound selected from the group consisting of an acetophenone-based compound, a benzophenone-based compound, a triazine-based compound, a biimidazole-based compound, an oxime-based compound and a thioxanthone-based compound, from the viewpoint of polymerization properties, initiation efficiency, absorption wavelength, availability, cost and the like.

Specific examples of the acetophenone-based compound include diethoxyacetophenone, 2-hydroxy-2-methyl-1-phenylpropan-one, benzyl dimethyl ketal, 2-hydroxy-1-[4-(2-hydroxyethoxy)phenyl]-2-methylpropan-1-one, 1-hydroxycyclohexylphenylketone, 2-methyl-1-(4-methylthiophenyl)-2-morpholinopropan-1-one, 2-benzyl-2-dimethylamino-1-(4-morpholinophenyl)butan-1-one, 2-hydroxy-2-methyl-1-[4-(1-methylvinyl)phenyl]propan-1-one or 2-(4-methylbenzyl)-2-(dimethylamino)-1-(4-morpholinophenyl) butan-1-one, etc.

Specific examples of the benzophenone-based compound include benzophenone, methyl o-benzoylbenzoate, 4-phenylbenzophenone, 4-benzoyl-4'-methyldiphenylsulfide, 3,3', 4,4'-tetra(tert-butylperoxycarbonyl)benzophenone or 2,4,6-trimethylbenzophenone, etc.

Specific examples of the triazine-based compound include 2,4-bis(trichloromethyl)-6-(4-methoxyphenyl)-1,3, 5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3, 5-triazine, 2,4-bis(trichloromethyl)-6-[2-(5-methylfuran-2-yl) ethenyl]-1,3,5-triazine, 2,4-bis(trichloromethyl)-6-[2-(furan-2-yl) ethenyl]-1,3,5-triazine, 2,4-bis (trichloromethyl)-6-[2-(4-diethylamino-2-methylphenyl) ethenyl]-1,3,5-triazine or 2,4-bis(trichloromethyl)-6-[2-(3, 4-dimethoxyphenyl) ethenyl]-1,3,5-triazine, etc.

Specific examples of the biimidazole-based compound include 2,2'-bis(2-chlorophenyl)-4,4',5,5'-tetraphenylbiimidazole, 2,2'-bis(2,3-dichlorophenyl)-4,4',5,5'-tetraphenylbiimidazole, 2,2'-bis(2-chlorophenyl)-4,4',5,5'-tetra(alkoxyphenyl)biimidazole, 2,2'-bis(2-chlorophenyl)-4,4',5,5'-tetra (trialkoxyphenyl)biimidazole, 2,2-bis(2,6-dichlorophenyl)-4,4',5,5'-tetraphenyl-1,2'-biimidazole or a biimidazole compound in which a phenyl group at the 4,4',5,5' position is substituted by a carboalkoxy group, etc. Among them, 2,2'-bis(2-chlorophenyl)-4,4',5,5'-tetraphenylbiimidazole, 2,2'-bis(2,3-dichlorophenyl)-4,4',5,5'-tetraphenylbiimidazole or 2,2-bis(2,6-dichlorophenyl)-4,4',5,5'-tetraphenyl-1, 2'-biimidazole are preferably used.

Specific examples of the oxime-based compound include o-ethoxycarbonyl-α-oxyimino-1-phenylpropan-1-one and the like, and commercially available products thereof typically include OXE01 and OXE02 manufactured by BASF.

Specific examples of the thioxanthone-based compound include 2-isopropylthioxanthone, 2,4-diethylthioxanthone, 2,4-dichlorothioxanthone or 1-chloro-4-propoxythioxanthone, etc.

In addition, photopolymerization initiators or the like other than those listed above may further be used in combination within a range in which the effects of the present invention are not impaired. For example, a benzoin-based compound or an anthracene-based compound, etc. may be mentioned, and they may be used alone or in combination of two or more thereof.

As the benzoin-based compound, for example, benzoin, benzoin methyl ether, benzoin ethyl ether, benzoin isopropyl ether or benzoin isobutyl ether, etc. may be mentioned.

As the anthracene-based compound, for example, 9,10-dimethoxyanthracene, 2-ethyl-9,10-dimethoxyanthracene, 9,10-diethoxyanthracene or 2-ethyl-9,10-diethoxyanthracene, etc. may be mentioned.

In addition, 2,4,6-trimethylbenzoyl diphenylphosphine oxide, 10-butyl-2-chloroacridone, 2-ethylanthraquinone, benzyl-9,10-phenanthrenequinone, camphorquinone, methyl phenylglyoxylate or titanocene compound, etc. may be additionally used in combination as photopolymerization initiators.

The photopolymerization initiator may be contained in an amount of 0.1 to 40% by weight, and preferably 1 to 30% by weight based on 100% by weight of the total solid content of the self-emission type photosensitive resin composition. When the amount of the photopolymerization initiator is within the above range, it is preferable because the self-emission type photosensitive resin composition is highly sensitized and the exposure time is shortened, and thus the productivity can be enhanced and high resolution can be maintained. Further, the strength of a pixel part formed using the composition having the aforementioned features and the smoothness on the surface of the pixel part may be improved.

In addition, a photopolymerization initiation adjuvant may be further contained to enhance the sensitivity of the self-emission type photosensitive resin composition. As the photopolymerization initiation adjuvant is contained, the sensitivity is further increased, thereby enhancing productivity.

As the photopolymerization initiation adjuvant, for example, at least one compound selected from the group consisting of an amine compound, a carboxylic acid compound and an organic sulfur compound having a thiol group may be preferably used.

Specific examples of the amine compound include an aliphatic amine compound such as triethanolamine, methyldiethanolamine, triisopropanolamine and the like; an aromatic amine compound such as methyl 4-dimethylaminobenzoate, ethyl 4-dimethylaminobenzoate, isoamyl 4-dimethylaminobenzoate, 2-ethylhexyl 4-dimethylaminobenzoate, 2-dimethylaminoethyl benzoate, N,N-dimethylparatoluidine, 4,4'-bis (dimethylamino)benzophenone (common name: Michler's ketone) or 4,4'-bis(diethylamino) benzophenone, etc. The aromatic amine compounds are preferably used.

The carboxylic acid compound may be preferably an aromatic heteroacetic acid, and specific examples thereof include phenylthioacetic acid, methylphenylthioacetic acid, ethylphenylthioacetic acid, methylethylphenylthioacetic acid, dimethylphenylthioacetic acid, methoxyphenylthioacetic acid, dimethoxyphenylthioacetic acid, chlorophenylthioacetic acid, dichlorophenylthioacetic acid, N-phenylglycine, phenoxyacetic acid, naphthylthioacetic acid, N-naphthylglycine or naphthoxyacetic acid, etc.

Specific examples of the organic sulfur compound having a thiol group include 2-mercaptobenzothiazole, 1,4-bis(3-mercaptobutyryloxy)butane, 1,3,5-tris(3-mercaptobutyloxyethyl)-1,3,5-triazine-2,4,6(1H,3H,5H)-trion, trimethylolpropane tris(3-mercaptopropionate), pentaerythritol tetrakis(3-mercaptobutyrate), pentaerythritol tetrakis(3-mercaptopropionate), dipentaerythritol hexakis(3-mercaptopropionate) or tetraethylene glycol bis(3-mercaptopropionate), etc.

Further, they are commercially available under the trade names Darocur 1173, Irgacure 184, Irgacure 907, Irgacure 1700 (from Ciba) or the like. They can be used alone or in combination of two or more thereof.

The content of the photopolymerization initiator adjuvant is preferably in the same range as that of the photopolymerization initiator. When the photopolymerization initiator adjuvant is used in an amount as described above, the sensitivity of the self-emission type photosensitive resin composition further increases, and it can provide an effect of improving the productivity of the color filter formed using the composition.

The solvent is not particularly limited, and it may be an organic solvent typically used in the art. The solvent used in a typical self-emission type photosensitive resin composition is not particularly limited as long as it is effective in dissolving other components, and it may be preferably ethers, aromatic hydrocarbons, ketones, alcohols, esters or amides, etc.

Specific examples of the solvent may include ethylene glycol monoalkyl ethers, such as ethylene glycol monomethyl ether, ethylene glycol monoethyl ether, ethylene glycol monopropyl ether, ethylene glycol monobutyl ether, and the like; diethylene glycol dialkyl ethers, such as diethylene glycol dimethyl ether, diethylene glycol diethyl ether, diethylene glycol dipropyl ether, diethylene glycol dibutyl ether, and the like; ethylene glycol alkyl ether acetates, such as methyl cellosolve acetate, ethyl cellosolve acetate, and the like; propylene glycol monoalkyl ethers, such as propylene glycol monomethyl ether, and the like; alkylene glycol alkyl ether acetates, such as propylene glycol monomethyl ether acetate, propylene glycol monoethyl ether acetate, propylene glycol monopropyl ether acetate, methoxybutyl acetate, methoxypentyl acetate, and the like; aromatic hydrocarbons, such as benzene, toluene, xylene, mesitylene, and the like; ketones, such as methyl ethyl ketone, acetone, methyl amyl ketone, methyl isobutyl ketone, cyclohexanone, and the like; alcohols, such as ethanol, propanol, butanol, hexanol, cyclohexanol, ethyleneglycol, glycerin, and the like; esters, such as ethyl 3-ethoxypropionate, methyl 3-methoxypropionate, and the like; cyclic esters, such as γ-butyrolactone, and the like. They may be used alone or in combination of two or more thereof.

As the viscosity of the solvent may vary depending on the coating method or device, the content thereof may be appropriately adjusted such that the concentration of the self-emission type photosensitive resin composition having the aforementioned composition is 5 to 90% by weight, preferably 15 to 80% by weight. The content is a range determined in consideration of the dispersion stability of the composition and the easiness of processing in the production process (for example, coating property).

The self-emission type photosensitive resin composition may further comprise scattering particles.

The scattering particles are used to increase light efficiency of the color filter. Light irradiated from a light source is made incident to the color filter while having a critical angle, and at this time, the incident light or the self-emission type light, which is emitted by quantum dots, exhibits a stronger light-emitting intensity due to an increase of the optical path as it encounters scattering particles, consequently increasing the light efficiency of the color filter. The scattering particles that can be used are any typical inorganic materials, and preferably, metal oxides can be used.

The metal oxides may be metal oxides containing at least one metal selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pz, Nd, Pm, Sm, Eu, Gd, Tb, Dy, Ho, Er, Tm, Yb, Ti, Sb, Sn, Zr, Nb, Ce, Ta and In.

Specifically, at least one selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO and MgO may be used. If necessary, those surface-treated with a compound having an unsaturated bond such as acrylate can also be used.

The average particle diameter of the scattering particles and the content thereof in the entire composition can be adjusted such that the light-emitting intensity of the color filter can be sufficiently enhanced. The scattering particles may preferably have an average particle diameter of 10 to 1000 nm, and more preferably, they may have an average particle diameter in the range of 50 to 500 nm. When the size of the scattering particles is too small, a sufficient scattering effect of the light emitted from the quantum dots cannot be expected. In contrast, when the size of the scattering particles is too large, they may sink in the composition, or it may be difficult to obtain the surfaces of the self-emission type layer having a uniform quality.

Further, the scattering particles may be contained in an amount of 0.1 to 50% by weight, preferably 0.5 to 30% by weight, based on 100% by weight of the self-emission type photosensitive resin composition. When the amount of the scattering particles is less than the above range, it may be difficult to secure the desired light-emitting intensity, and when the amount exceeds the above range, the effect of increasing the light-emitting intensity is no longer insignificant and also, the stability of the composition may be deteriorated.

The alkali-soluble resin is used in combination with the scattering particles, thereby preventing sinking of the scattering particles over time.

The self-emission type photosensitive resin composition may further comprise known additives for various purposes. As such additives, fillers, other polymer compounds, surfactants, adhesion promoters, antioxidants, UV absorbers, anti-agglomeration agents can be used in combination. At least one or two of these additives can be added, and they may be preferably used in an amount of 1% by weight or less based on the total composition in consideration of light efficiency or the like.

Specific examples of the filler include glass, silica, alumina and the like.

Specific examples of the other polymer compound include a curable resin, such as epoxy resin, maleimide resin, and the like; and a thermoplastic resin, such as polyvinyl alcohol, polyacrylic acid, polyethylene glycol monoalkyl ether, polyfluoroalkyl acrylate, polyester, polyurethane, and the like.

The surfactant is a component which enhances the film-forming property of the self-emission type photosensitive resin composition, and may include, for example, polyoxyethylene alkyl ethers, polyoxyethylene alkylphenyl ethers, polyethylene glycol diesters, sorbitan fatty acid esters, fatty acid-modified polyesters, tertiary amine-modified polyurethanes, polyethyleneimines, and the like. In addition, commercially available products thereof include KP (manufactured by Shin-Etsu Chemical Co., Ltd), POLYFLOW (manufactured by Kyoeisha chemical Co., Ltd), EFTOP (manufactured by Tochem Products Co., Ltd.), MEGAFAC (manufactured by DIC corporation), Flourad (SUMITOMO 3M Limited), Asahi guard, Surflon (manufactured by Asahi Glass Co., Ltd), SOLSPERSE (manufactured Zeneca Co., Ltd), EFKA (manufactured by EFKA Chemicals Co., Ltd), PB 821 (manufactured by Ajinomoto Co., Ltd) and the like.

Specific examples of the adhesion promoter include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and the like.

Specific examples of the antioxidant include 2,2'-thiobis (4-methyl-6-t-butylphenol), 2,6-di-t-butyl-4-methylphenol and the like.

Specific examples of the UV absorber include 2-(3-t-butyl-2-hydroxy-5-methylphenyl)-5-chlorobenzotriazole, alkoxy benzophenone and the like. Specific examples of the anti-agglomeration agent include sodium polyacrylate and the like.

<Light Transmission Layer>

In one embodiment of the present invention, the light transmission layer is a transparent gas barrier layer which transmits a light moving between the wavelength conversion layer and the wavelength filter layer and blocks the flow of outgas. The light transmission layer blocks the flow of outgas generated in the wavelength filter layer during a post-bake process carried out at high temperature for the production of a color filter, thereby preventing the deterioration of light-emitting efficiency and light retention rate of quantum dots in the wavelength conversion layer.

The light transmission layer has a light transmittance of 80% or more, for example, 80 to 100%.

The light transmission layer may have a thickness of 0.9 to 5.0 μm, preferably 1.0 to 3.0 μm.

Specifically, the light transmission layer may be a cured layer of a thermosetting or photocurable resin composition. For example, the light transmission layer may be a cured layer of a thermosetting or photocurable resin composition comprising scattering particles.

The thermosetting resin composition may comprise an alkali-soluble resin, a thermosetting compound and a solvent.

Further, the thermosetting resin composition may further comprise scattering particles.

The alkali-soluble resin may be the same as those used for the self-emission type photosensitive resin composition forming the wavelength conversion layer.

The content of the alkali-soluble resin in the thermosetting resin composition used for the light transmission layer is preferably 0.5 to 50% by weight based on 100% by weight of the total amount of the thermosetting resin composition. Due to high curing density of the coating film in the above range, the diffusion of the outgas through the light transmission layer can be prevented, thereby increasing light-emitting efficiency and light retention rate.

As the thermosetting compound, bisphenol A type epoxy resin, bisphenol F type epoxy resin, bisphenol S type epoxy resin, diphenyl ether type epoxy resin, hydroquinone type epoxy resin, naphthalene type epoxy resin, biphenyl type epoxy resin, fluorene epoxy resin, phenol novolak type epoxy resin, orthocresol novolak type epoxy resin, trishydroxyphenyl methane type epoxy resin, trifunctional type epoxy resin, tetraphenol ethane type epoxy resin, dicyclopentadiene phenol type epoxy resin, hydrogenated bisphenol A type epoxy resin, polypropylene glycol type epoxy resin, glycidyl ester type epoxy resin, glycidyl amine type epoxy resin, glyoxal type epoxy resin, polyfunctional alicyclic epoxy resin, heterocyclic epoxy resin, bisphenol A novolak type epoxy resin and the like may be used.

The weight average molecular weight of the thermosetting compound in terms of polystyrene is preferably 1,000 to 50,000. When the weight average molecular weight of the thermosetting compound is within the above range, the transparency, flatness and heat resistance are excellent.

The thermosetting compound may be contained in an amount of 0.5 to 40% by weight, preferably 1 to 20% by weight based on 100% by weight of the total amount of the thermosetting resin composition. When the content of the thermosetting compound is within the above range, the transparency and flatness are improved.

The solvent may be the same as those used in the self-emission type photosensitive resin composition forming the wavelength conversion layer, and the content thereof may be 10 to 90% by weight based on 100% by weight of the total amount of the thermosetting resin composition. Within the above content range of the solvent, the coating property is improved.

The scattering particles may be the same those used in the self-emission type photosensitive resin composition forming the wavelength conversion layer, and the content thereof may be 0.1 to 50% by weight, preferably 0.5 to 30% by weight based on 100% by weight of the total amount of the thermosetting resin composition.

The photocurable resin composition may comprise an alkali-soluble resin, a photopolymerizable compound, a photopolymerization initiator and a solvent.

Further, the photocurable resin composition may further comprise scattering particles.

The alkali-soluble resin, photopolymerizable compound, photopolymerization initiator, solvent and scattering particles in the photocurable resin composition used for the production of the light transmission layer may be the same as those used in the self-emission type photosensitive resin composition forming the wavelength conversion layer. Furthermore, the photocurable resin composition used in the production of the light transmission layer may further comprise the same additives as those used in the self-emission type photosensitive resin composition forming the wavelength conversion layer.

In the photocurable resin composition, the content of the alkali-soluble resin may be 0.5 to 50% by weight based on 100% by weight of the total solid content of the photocurable resin composition. The content of the photopolymerizable compound may be 0.5 to 40% by weight based on 100% by weight of the total solid content of the photocurable resin composition. The photopolymerization initiator may be contained in an amount of 0.1 to 40% by weight based on 100% by weight of the total solid content of the photocurable resin composition. The solvent may be contained in an amount of 10 to 90% by weight based on 100% by weight of the total amount of the photocurable resin composition. The scattering particles may be contained in an amount of 0.1 to 50% by weight based on 100% by weight of the total amount of the photocurable resin composition.

<Wavelength Filter Layer>

In one embodiment of the present invention, the wavelength filter layer is a layer which selectively blocks a light of a specific wavelength band and selectively transmits a light of another specific wavelength band among the incident light.

The wavelength filter layer may be a cured layer of a colored photosensitive resin composition.

For example, the wavelength filter layer may be a cured layer of a yellow or red photosensitive resin composition. In this case, the wavelength filter layer may block a light of the blue wavelength band by the blue light source and transmits a light of the red and green wavelength bands. Thus, the wavelength filter layer is formed in regions corresponding to the red pixel layer and green pixel layer so that the light emitted from the red pixel layer and the green pixel layer is not mixed with the light of the blue wavelength band by the blue light source, thereby preventing the deterioration of color purity of red and green colors, and the light of the red and green wavelength bands is not blocked, thereby preventing the deterioration of light efficiency.

The wavelength filter layer may have a thickness of 0.9 to 5.0 μm, preferably 1.0 to 4.0 μm.

The colored photosensitive resin composition may comprise a coloring agent, an alkali-soluble resin, a photopolymerizable compound, a photopolymerization initiator and a solvent.

The coloring agent may include at least one selected from a yellow coloring agent and a red coloring agent.

The yellow coloring agent and the red coloring agent are not particularly limited in the present invention, and any yellow or red coloring agents known in the art may be used. Specifically, those given following color index (C.I.; The Society of Dyers and Colourists issued) numbers can be mentioned. However, it is preferable that the coloring agents are halogen-free in view of reduction of environmental load and human influence.

Monoazo-based pigments: pigment yellow 1, 2, 5, 8, 105, 120, 150, 168, 182, 183 and 190;

Pyrazolone azo-based pigments: pigment yellow 10;

Disazo-based pigments: pigment yellow 12, 16, 63, 83, 126, 127, 128, 152, 170 and 188;

Azomethine-based pigments: pigment yellow 101 and 129;

Anthraquinone-based pigments: pigment yellow 108, 147, 193, 197, 199 and 202;

Isoindolinone-based pigments: pigment yellow 109, 110, 139, 173 and 185;

Quinoline-based pigments: pigment yellow 115;

Quinophthalone-based pigments: pigment yellow 138 and 231;

Polycyclic-based pigments: pigment yellow 148;

Dioxime-based pigments: pigment yellow 153;

Benzimidazolone-based pigments: pigment yellow 154, 175, 180 and 181;

Heterocyclic-based pigments: pigment yellow 192;

Perinone-based pigments: pigment yellow 196;

Inorganic pigments: pigment yellow 31, 32, 30, 119, 157, 162 and 184;

Quinacridone-based pigments: pigment red 122 and 202;

Anthraquinone-based pigments: pigment red 177;

Perylene-based pigments: pigment red 155 and 224;

Diketopyrrolopyrrole-based pigments: pigment red 254;

Disazo-based pigments: pigment red 37, 38, 41, 144, 166, 214, 220, 221 and 242.

In particular, among the coloring agents listed above, pigment yellow 138, pigment yellow 150, pigment yellow 139, pigment yellow 185, pigment yellow 231, pigment red 177, pigment red 254 and pigment red 242 may be preferably used.

These pigments may have been subjected to rosin treatment, surface treatment using pigment derivatives having an introduced acidic group or basic group, surface graft treatment using a polymer compound or the like, particle micronization treatment using sulfuric acid, or washing treatment with an organic solvent or water, etc., as needed.

The coloring agent may be contained in an amount of 5 to 80% by weight, preferably 10 to 50% by weight based on 100% by weight of the total solid content of the colored photosensitive resin composition. When the content of the coloring agent is less than 5% by weight, the effect of improving color purity and light efficiency can be hardly expected. In contrast, when the content of the coloring agent is more than 80% by weight, there is no significant increase in terms of effect and thus is not economical. Thus, it should be appropriately used within the above range.

The coloring agent can be used together with a dispersing agent and a dispersion adjuvant, as needed.

As the dispersing agent, for example, a suitable dispersing agent such as cationic, anionic, or nonionic type can be used, but a polymer dispersing agent is preferable. Specifically, examples thereof include acrylic copolymers, polyurethanes, polyesters, polyethyleneimines, polyallylamines and the like. These dispersing agents are commercially available, and examples thereof include DisperBYK-2000, DisperBYK-2001, BYK-LPN6919, BYK-LPN21116 (manufactured by BYK Chemie), and Solsperse 5000 (manufactured by Lubrizol) as the acrylic copolymers. As the polyurethanes, DisperBYK-161, DisperBYK-162, DisperBYK-163, DisperBYK-165, DisperBYK-167, DisperBYK-170, DisperBYK-182 (manufactured by BYK Chemie), Solsperse 76500 (manufactured by Lubrizol) may be mentioned. As the polyethyleneimines, Solsperse 24000 (manufactured by Lubrizol) may be mentioned. As the polyesters, AJISPER PB821, AJISPER PB822, AJISPER PB880 (manufactured by Ajinomoto Fine-Techno Co., Ltd) and the like may be mentioned.

As the dispersion adjuvant, for example, pigment derivatives may be mentioned, and specifically, copper phthalocyanine, diketopyrrolopyrrole, sulfonic acid derivatives of quinophthalone and the like may be mentioned.

These dispersing agents can be used alone or in combination of two or more thereof. The content of the dispersing agent is typically 1 part by weight or less, preferably 0.1 to 0.7 part by weight, more preferably 0.05 to 0.5 part by weight, based on 1 part by weight of the coloring agent. When the content of the dispersing agent is excessively large, there is a possibility that developability and the like may be damaged.

The alkali-soluble resin, photopolymerizable compound, photopolymerization initiator and the solvent in the colored photosensitive resin composition used for the production of the wavelength filter layer may be the same as those used for the self-emission type photosensitive resin composition forming the wavelength conversion layer in terms of type and content. In addition, the colored photosensitive resin composition used in the production of the wavelength filter layer may further comprise the same type and content of additives as those used for the self-emission type photosensitive resin composition forming the wavelength conversion layer.

<Preparation of Color Filter>

The color filter according to one embodiment of the present invention may be prepared by a method including the steps of:

S1) forming a self-emission type pixel layer on a substrate to obtain a wavelength conversion layer;

S2) forming a light transmission layer on the upper part of the wavelength conversion layer; and S3) forming a wavelength filter layer on the upper part of the light transmission layer.

The color filter according to another embodiment of the present invention may be prepared by a method including the steps of:

S1-1) forming a wavelength filter layer on a substrate;

S2-1) forming a light transmission layer on the upper part of the wavelength filter layer; and S3-1) forming a self-emission type pixel layer on the upper part of the light transmission layer to obtain a wavelength conversion layer.

Before forming the self-emission type pixel layer, partition walls defining red, blue, and green pixel regions may be formed on the substrate or the light transmission layer, and the self-emission type pixel layer may be formed in the pixel regions.

In this case, the wavelength filter layer may be formed only on the parts corresponding to the red and green pixel regions.

The partition walls, the self-emission type pixel layer, the light transmission layer, and the wavelength filter layer may be formed by applying each composition, followed by exposing, developing and curing the composition in a predetermined pattern.

The curing may be carried out through a post-baking process which is generally carried out at high temperature.

The color filter according to one embodiment of the present invention forms the light transmission layer between the wavelength conversion layer and the wavelength filter layer, which prevents damage of the quantum dots contained in the wavelength conversion layer, and thus has excellent light-emitting efficiency and light retention rate.

<Image Display Device>

One embodiment of the present invention provides an image display device having the color filter.

The color filter of the present invention is applicable not only to a typical liquid crystal display device but also to various image display devices such as electroluminescence display device, plasma display device, field emission display device and the like.

The image display device of the present invention may have a color filter having a wavelength conversion layer including a red pixel layer containing red quantum dot particles, a green pixel layer containing green quantum dot particles, and a blue pixel layer containing blue quantum dot particles. When such a color filter is applied to an image display device, the emitted light of a light source is not particularly limited, but a light source emitting a blue light may be preferably used in view of superior color reproductivity.

According to another embodiment of the present invention, the image display device of the present invention may have a color filter having a wavelength conversion layer only including two types of pixel layers among the red pixel layer, green pixel layer, and blue pixel layer. In this case, the wavelength conversion layer may further include a transparent pattern layer containing no quantum dot particles.

When the color filter only includes the pixel layers of two colors, a light source emitting a light having a wavelength representing the color, which is not included therein, can be used. For example, when the color filter includes the red pixel layer and green pixel layer, a light source that emits a blue light may be used. In this case, the red quantum dot particles emit a red light and the green quantum dot particles emit a green light, and the transparent pattern layer transmits the blue light as it is, thereby exhibiting a blue color.

The image display device of the present invention has excellent light efficiency, thereby exhibiting high brightness, and has excellent color reproducibility and a wide viewing angle.

Hereinafter, the present invention will be described in more detail by way of Examples, Comparative Examples and Experimental Examples. However, these Examples, Comparative Examples and Experimental Examples are given for illustrative purposes only, and it would be apparent to those skilled in the art that the scope of the invention is not intended to be limited by these Examples.

Synthesis Example 1: Synthesis of Photoluminescence Green Quantum Dot Particles Having CdSe/ZnS Core-Shell Structure CdO (0.4 mmol), zinc acetate (4 mmol) and oleic acid (5.5 mL) were added to a reactor together with 1-octadecene (20 mL), and the mixture was reacted by heating it to 150° C. Then, in order to remove acetic acid formed by a substitution of oleic acid with zinc, the reactant was allowed to stand under vacuum at 100 mTorr for 20 minutes. Subsequently, a transparent mixture was obtained by applying heat at 310° C., and the mixture was maintained at 310° C. for 20 minutes. Then, Se and S solutions, in which 0.4 mmol of Se powder and 2.3 mmol of S powder were dissolved in 3 mL of trioctylphosphine, respectively, were rapidly injected into a reactor containing $Cd(OA)_2$ and $Zn(OA)_2$ solutions.

The mixture thus obtained was grown at 310° C. for 5 minutes, and then the growth was allowed to stop using an ice bath.

Subsequently, quantum dots were separated using a centrifuge by precipitating with ethanol, and the excess impurities were washed with chloroform and ethanol, thereby obtaining green quantum dot particles having a CdSe(core)/ZnS(shell) structure, which were stabilized with oleic acid and have a sum of core particle diameter and shell thickness of 3 to 5 nm.

Synthesis Example 2: Synthesis of Alkali-Soluble Resin 1

120 parts by weight of propylene glycol monomethyl ether acetate, 80 parts by weight of propylene glycol monomethyl ether, 2 parts by weight of AIBN, 5.0 parts by weight of acrylic acid, 55.0 parts by weight of 4-methylstyrene, 20 parts by weight of benzyl methacrylate, 20 parts by weight of methyl methacrylate and 3 parts by weight of n-dodecanethiol were added to a flask having a stirrer, a thermometer, a reflux condenser, a dropping lot and a nitrogen inlet, and then the atmosphere in the flask was replaced with nitrogen. Then, the reaction temperature was raised to 80° C. while stirring, and the mixture was reacted for 8 hours. The acid value for the solid content of the thus-synthesized alkali-soluble resin 1 was 17.4 mg KOH/g and the weight average molecular weight (Mw) measured by GPC was about 17,370.

Synthesis Example 3: Synthesis of Alkali-Soluble Resin 2

A flask having a stirrer, a thermometer, a reflux condenser, a dropping lot and a nitrogen inlet was prepared. Separately, 45 parts by weight of N-benzylmaleimide, 45 parts by weight of methacrylic acid, 10 parts by weight of tricyclodecyl methacrylate, 4 parts by weight of t-butylperoxy-2-ethylhexanoate, and 40 parts by weight of propylene glycol monomethyl ether acetate were added and then mixed with stirring to prepare a monomer dropping lot, and 6 parts by weight of n-dodecanethiol and 24 parts by weight of propylene glycol monomethyl ether acetate were added and mixed with stirring to prepare a chain transfer agent dropping lot.

Next, 395 parts by weight of propylene glycol monomethyl ether acetate was introduced into the flask, then, the atmosphere in the flask was changed from air to nitrogen, and the temperature of the flask was raised to 90° C. while stirring.

Then, the monomer and chain transfer agent were dropped from the dropping lot. The dropping was each carried out for 2 hours while maintaining at 90° C., and then after 1 hour, the temperature was raised to 110° C. and maintained for 3 hours. Then, a gas inlet was introduced to initiate bubbling of mixed gases of oxygen/nitrogen-5/95 (v/v).

Then, 10 parts by weight of glycidyl methacrylate, 0.4 part by weight of 2,2'-methylenebis(4-methyl-6-t-butylphenol) and 0.8 part by weight of triethylamine were introduced into the flask, and the reaction was continuously carried out at 110° C. for 8 hours. Thereafter, an alkali-soluble resin 2 having a solid content of 29.14 by weight, a weight average molecular weight of 32,000 and an acid value of 114 mg KOH/g was obtained while cooling the resultant to room temperature.

Preparation Example 1: Preparation of Self-Emission Type Photosensitive Resin Compositions for Formation of Wavelength Conversion Layer The respective components were mixed as shown in Table 1 below (wt %). Thereafter, the mixture was diluted with propylene glycol monomethyl ether acetate so that the total solid content was 20% by weight, and then sufficiently stirred to obtain self-emission type photosensitive resin compositions.

TABLE 1

| | | Compositions (wt %) | |
|---|---|---|---|
| | | Preparation Example 1-1 | Preparation Example 1-2 |
| Quantum dots | 1-1[1] | 30 | — |
| | 1-2[2] | — | 30 |
| Photopolymerizable compound[3] | | 30 | 30 |
| Photopolymerization initiator[4] | | 5 | 5 |
| Alkali-soluble resin [5] | | 35 | 35 |

[1] Quantum dot 1-1: Quantum dot having CdSe(core)/ZnS(shell) structure of Synthesis Example 1
[2] Quantum dot 1-2: Lumidot ™ CdSe/ZnS 640 (manufactured by Sigma-Aldrich)
[3] Photopolymerizable compound: Dipentaerythritol pentaacrylate succinic acid monoester (carboxylic acid-containing penta-functional photopolymerizable compound) (TO-1382, manufactured by Toagosei)
[4] Photopolymerizaton initiator: Irgacure-907 (manufactured by Ciba)
[5] Alkali-soluble resin: Alkali-soluble resin 1 of Synthesis Example 2

Preparation Example 2: Preparation of Colored Photosensitive Resin Compositions for Formation of Wavelength Filter Layer The respective components were mixed as shown in Table 2 below (wt %). Thereafter, the mixture was diluted with propylene glycol monomethyl ether acetate so that the total solid content was 20% by weight, and then sufficiently stirred to obtain colored photosensitive resin compositions.

TABLE 2

| Compositions (wt %) | | Preparation Example 2-1 | Preparation Example 2-2 | Preparation Example 2-3 | Preparation Example 2-4 | Preparation Example 2-5 |
|---|---|---|---|---|---|---|
| Coloring agent[1] | A-1 | 30 | — | — | — | — |
| | A-2 | — | 30 | — | — | — |
| | A-3 | — | — | 30 | — | — |
| | A-4 | — | — | — | 30 | — |
| | A-5 | — | — | — | — | 30 |
| Photopolymerizable compound[2] | | 30 | 30 | 30 | 30 | 30 |
| Photopolymerization initiator[3] | | 5 | 5 | 5 | 5 | 5 |
| Alkali-soluble resin[4] | | 35 | 35 | 35 | 35 | 35 |

[1] Coloring agents
A-1: pigment yellow 138
A-2: pigment yellow 150
A-3: pigment red 254
A-4: pigment red 177
A-5: pigment red 242
[2] Photopolymerizable compound: Dipentaerythritol pentaacrylate succinic acid monoester (carboxylic acid-containing penta-functional photopolymerizable compound) (TO-1382, manufactured by Toagosei)
[3] Photopolymerization initiator: Irgacure OXE01 (manufactured by BASF)
[4] Alkali-soluble resin: Alkali-soluble resin 2 of Synthesis Example 3

Preparation Example 3: Preparation of Curable Resin Compositions for Formation of Light Transmission Layer Curable resin compositions were prepared by mixing the respective components as shown in Table 3 below (unit: wt %)

TABLE 3

|  |  | Preparation Example 3-1 | Preparation Example 3-2 | Preparation Example 3-3 | Preparation Example 3-4 | Preparation Example 3-5 | Preparation Example 3-6 |
|---|---|---|---|---|---|---|---|
| Resin(A) | Synthesis Example 2 | 11.5 | 0 | 11.5 | 0 | 11.5 | 0 |
|  | Synthesis Example 3 | 0 | 11.5 | 0 | 11.5 | 0 | 11.5 |
| Thermosetting compound(B1) | B1-1 | 3.5 | 0 | 0 | 0 | 0 | 0 |
|  | B1-2 | 0 | 3.5 | 0 | 0 | 0 | 0 |
| Photopolymerizable compound(B2) | B2 |  |  | 3.8 | 3.8 | 3.8 | 3.8 |
| Photopolymerization initiator(C) | C1 | 0 | 0 | 0.77 | 0.77 | 0.77 | 0.77 |
| Solvent(D) | D1 | 74.88 | 74.88 | 83.81 | 83.81 | 78.81 | 78.81 |
|  | D2 | 10 | 10 | — | — | — | — |
| Additives(E) | E1 | 0.1 | 0.1 | 0.1 | 0.1 | 0.1 | 0.1 |
|  | E2 | 0.02 | 0.02 | 0.02 | 0.02 | 0.02 | 0.02 |
| Scattering particles(F) | F1 | — | — | — | — | 5 | 5 |

B1-1: Bisphenol A novolak type epoxy resin (JER157S70, manufactured by JER Co., Ltd, Epoxy equivalent: 210 g/eq)
B1-2: Polyfunctional alicyclic epoxy resin (EHPE3150, manufactured by Daicel Corporation, Epoxy equivalent: 740 g/eq)
B2: KAYARAD DPHA (manufactured by NIPPON KAYAKU)
C1: Irgacure OXE01 (Manufactured by BASF)
D1: Propylene glycol monomethyl ether acetate
D2: Methyl 3-methoxypropionate
E1: 3-glycidoxypropyltrimethoxysilane (KBM-403, manufactured by Shin-Etsu Chemical Co., Ltd)
E2: MEGAFAC 475 (manufactured by DIC Corporation)
F1: $TiO_2$ (TR-88, manufactured by Huntsman Corporation)

Experimental Example 1: Analysis of Transmission Properties of the Colored Photosensitive Resin Compositions for Formation of Wavelength Filter Layer The transmission properties of the colored photosensitive resin compositions prepared in Preparation Example 2 were confirmed as follows.

First, each of the compositions prepared in Preparation Examples 2-1 to 2-5 was coated onto a glass substrate by a spin coating method, and then placed on a heating plate and kept at a temperature of 100° C. for 3 minutes to form a thin film.

Subsequently, light was irradiated at an exposure amount (365 nm) of 200 mJ/cm² using an ultra-high pressure mercury lamp (trade name: USH-250D, manufactured by Ushio Denki K.K.) under atmospheric conditions, and no special optical filter was used. Then, the resultant was heated in a heating oven at 150° C. for 10 minutes to prepare a wavelength filter layer with a thickness of 2 μm.

The transmittance of the thus-prepared wavelength filter layer was measured using a spectrometer OPS-200 (manufactured by Olympus), and the obtained results are shown in Table 4 below.

TABLE 4

| | Category | | | | |
|---|---|---|---|---|---|
| | Preparation Example 2-1 | Preparation Example 2-2 | Preparation Example 2-3 | Preparation Example 2-4 | Preparation Example 2-5 |
| λ (nm) | 490 | 485 | 590 | 610 | 590 |
| $T_\lambda$ | 54.7 | 56.1 | 92.66 | 91.11 | 92.73 |
| $T_{\lambda-30\,nm}$ | 0.5 | 1.2 | 20.01 | 14.32 | 23.74 |
| $T_{\lambda+30\,nm}$ | 93.2 | 90.1 | 99.46 | 98.74 | 98.45 |

As shown in Table 4, it was confirmed that the yellow wavelength filter layers of Preparation Example 2-1 and Preparation Example 2-2 showed $T_{\lambda+30\,nm}$ of 90% or more, and the red wavelength filter layers of Preparation Examples 2-3 to 2-5 also showed $T_{\lambda+30\,nm}$ of 90% or more. Further, it was confirmed that the yellow wavelength filter layers of Preparation Example 2-1 and Preparation Example 2-2 showed $T_{\lambda-30\,nm}$ of 2% or less, and the red wavelength filter layers of Preparation Examples 2-3 to 2-5 showed $T_{\lambda-30\,nm}$ of 25% or less. Thus, the yellow wavelength filter layers of Preparation Example 2-1 and Preparation Example 2-2 and the red wavelength filter layers of Preparation Examples 2-3 to 2-5 showed low transmittance in the low wavelength band, that is, in the blue wavelength band, thereby effectively blocking a light of the blue wavelength, and showed high transmittance in the high wavelength bands, that is, in the yellow and red wavelength bands, thereby confirming that the light efficiency was not deteriorated.

Examples 1 to 7 and Comparative Example 1 to 4: Preparation of Color Filters

Color filters were prepared according to the method described below with the compositions shown in Tables 5 and 6, by using the compositions prepared in Preparation Examples 1 to 3.

TABLE 5

| Compositions | Example 1 | Example 2 | Example 3 | Example 4 | Example 5 | Example 6 | Example 7 |
|---|---|---|---|---|---|---|---|
| Wavelength filter layer | Preparation Example 2-1 | Preparation Example 2-2 | Preparation Example 2-3 | Preparation Example 2-4 | Preparation Example 2-5 | Preparation Example 2-3 | Preparation Example 2-4 |
| Light transmission layer | Preparation Example 3-1 | Preparation Example 3-2 | Preparation Example 3-3 | Preparation Example 3-4 | Preparation Example 3-1 | Preparation Example 3-5 | Preparation Example 3-6 |
| Wavelength conversion layer | Preparation Example 1-1 | Preparation Example 1-1 | Preparation Example 1-2 | Preparation Example 1-2 | Preparation Example 1-2 | Preparation Example 1-2 | Preparation Example 1-2 |
| Light source | Blue light source | Blue light source | Blue light source | Blue light source | Blue light source | Blue light source | Blue light source |

TABLE 6

| | Composition | | | |
|---|---|---|---|---|
| | Comparative Example 1 | Comparative Example 2 | Comparative Example 3 | Comparative Example 4 |
| Wavelength filter layer | Preparation Example 2-1 | Preparation Example 2-2 | Preparation Example 2-3 | Preparation Example 2-4 |
| Wavelength conversion layer | Preparation Example 1-1 | Preparation Example 1-1 | Preparation Example 1-2 | Preparation Example 1-2 |
| Light source | Blue light source | Blue light source | Blue light source | Blue light source |

(1) Formation of Wavelength Conversion Layer

The self-emission type photosensitive resin composition of Preparation Example 1 was coated onto a glass substrate by a spin coating method, and then placed on a heating plate and kept at a temperature of 100° C. for 3 minutes to form a thin film.

Subsequently, light was irradiated at an exposure amount (365 nm) of 200 mJ/cm$^2$ using an ultra-high pressure mercury lamp (trade name: USH-250D, manufactured by Ushio Denki K.K.) under atmospheric conditions, and no special optical filter was used.

The thin film irradiated with ultraviolet light was immersed in a KOH aqueous developing solution of pH 10.5 for 80 seconds to have it developed. The glass substrate coated with the thin film was washed with distilled water, then dried by blowing nitrogen gas, and heated in a heating oven at 150° C. for 10 minutes to form a self-emission type pixel layer having a thickness of 5 μm.

(2) Formation of Light Transmission Layer

When the photocurable resin compositions of Preparation Examples 3-3 to 3-6 were used, a light transmission layer having a thickness of 2 μm was formed on the wavelength conversion layer in the same manner as in the method used in the formation of the wavelength conversion layer, except that the photocurable resin compositions of Preparation Examples 3-3 to 3-6 were used, and that the developing process was omitted.

When the thermosetting resin compositions of Preparation Example 3-1 and Preparation Example 3-2 were used, a light transmission layer was formed on the wavelength conversion layer as follows.

The thermosetting resin compositions were spin-coated onto the wavelength conversion layer, then placed on a heating plate, and kept at a temperature of 100° C. for 3 minutes to form a coating film. Subsequently, the resultant was subjected to a heat treatment in an oven at 230° C. for 60 minutes to prepare a light transmission layer having a thickness of 2 μm.

(3) Formation of Wavelength Filter Layer

The colored photosensitive resin composition of Preparation Example 2 for the formation of the wavelength filter layer was coated onto the light transmission layers by a spin coating method, then placed on a heating plate, and kept at a temperature of 100° C. for 3 minutes to form a thin film.

Then, light was exposed at an exposure amount (365 nm) of 200 mJ/cm$^2$ using an ultra-high pressure mercury lamp (trade name: USH-250D, manufactured by Ushio Denki K.K.) under atmospheric conditions, and no special optical filter was used.

The thin film irradiated with ultraviolet light was immersed in a KOH aqueous developing solution of pH 10.5 for 80 seconds to have it developed. The glass substrate coated with the thin film was washed with distilled water, then dried by blowing nitrogen gas, and heated in a heating oven at 230° C. for 20 minutes to form a wavelength filter layer having a thickness of 2 μm.

Experimental Example 2: Measurement of Light Retention Rates of Color Filters

The external quantum efficiency after light-exposure of the color filters of Examples 1 to 7 and Comparative Examples 1 to 4 and the external quantum efficiency after the post-bake treatment at 180° C. for minutes for the first time, the second time and the third time, and at 230° C. for 20 minutes for the fourth time were measured using QD-2100 manufactured by Otsuka Chemical Co., Ltd., and the results are shown in Table 7 below.

The light retention rate was calculated by the following Mathematical Formula 1 and is shown in Table 8 below.

Light retention rate (%)=[external quantum efficiency after post-bake treatment]/[external quantum efficiency after light-exposure]×100

[Mathematical Formula 1]

TABLE 7

External Quantum Efficiency (%)

| | After light-exposure | Post bake 1$^{st}$ time (180° C./ 30 min) | Post bake 2$^{nd}$ time (180° C./ 30 min) | Post bake 3$^{rd}$ time (180° C./ 30 min) | Post bake 4$^{th}$ time (230° C./ 20 min) |
|---|---|---|---|---|---|
| Example 1 | 24.5 | 23.6 | 23.2 | 22.8 | 21.6 |
| Example 2 | 25.1 | 24.8 | 24.1 | 23.6 | 22.3 |
| Example 3 | 24.0 | 23.2 | 22.7 | 22.4 | 21.3 |
| Example 4 | 24.7 | 24.1 | 23.4 | 23.3 | 22.0 |
| Example 5 | 25.1 | 24.1 | 23.3 | 22.7 | 21.9 |
| Example 6 | 25.6 | 24.8 | 24.3 | 24.0 | 22.9 |
| Example 7 | 25.7 | 24.8 | 24.4 | 24.0 | 22.8 |
| Comparative Example 1 | 24.4 | 20.7 | 20.1 | 19.5 | 17.6 |
| Comparative Example 2 | 20.1 | 13.6 | 12.9 | 12.7 | 10.7 |
| Comparative Example 3 | 23.1 | 17.0 | 15.4 | 14.1 | 4.3 |
| Comparative Example 4 | 23.0 | 18.3 | 17.2 | 16.4 | 13.1 |

TABLE 8

Results
Light retention rate (%)

| | After light-exposure | Post bake 1$^{st}$ time (180° C./ 30 min) | Post bake 2$^{nd}$ time (180° C./ 30 min) | Post bake 3$^{rd}$ time (180° C./ 30 min) | Post bake 4$^{th}$ time (230° C./ 20 min) |
|---|---|---|---|---|---|
| Example 1 | 100.00% | 96.33% | 94.69% | 93.06% | 88.00% |
| Example 2 | 100.00% | 98.80% | 96.02% | 94.02% | 89.00% |
| Example 3 | 100.00% | 96.67% | 94.58% | 93.33% | 88.75% |
| Example 4 | 100.00% | 97.57% | 94.74% | 94.33% | 89.07% |
| Example 5 | 100.00% | 96.02% | 92.83% | 90.44% | 87.25% |
| Example 6 | 100.00% | 96.88% | 94.92% | 93.75% | 89.45% |
| Example 7 | 100.00% | 96.50% | 94.94% | 93.39% | 88.56% |
| Comparative Example 1 | 100.00% | 84.84% | 82.38% | 79.92% | 72.13% |
| Comparative Example 2 | 100.00% | 67.66% | 64.18% | 63.18% | 53.23% |
| Comparative Example 3 | 100.00% | 73.59% | 66.67% | 61.04% | 18.61% |
| Comparative Example 4 | 100.00% | 79.57% | 74.78% | 71.30% | 56.96% |

As shown in Tables 7 and 8, it was confirmed that the color filters of Examples 1 to 7, which comprise the light transmission layer, showed excellent external quantum efficiency and also showed excellent light retention rate properties compared to the color filters of Comparative Examples 1 to 4 comprising no light transmission layer.

Therefore, it was confirmed that the external quantum efficiency and the light retention rate according to the heat treatment process can be greatly influenced by the presence or absence of the light transmission layer between the wavelength conversion layer and the wavelength filter layer.

Although specific parts of the present invention have been described in detail, it will be apparent to those skilled in the art that these specific techniques are merely a preferred embodiment and that the scope of the present invention is not limited thereto. In addition, those skilled in the art will appreciate that various applications and modifications are possible, without departing from the scope and spirit of the invention based on the description above.

Therefore, the substantial scope of the present invention will be defined by the accompanying claims and their equivalents.

The invention claimed is:

1. A color filter comprising a wavelength conversion layer which converts the wavelength of light, a light transmission layer formed on the wavelength conversion layer and a wavelength filter layer formed on the light transmission layer, wherein the wavelength conversion layer includes a self-emission type pixel layer containing quantum dots, wherein the self-emission type pixel layer is a cured layer of a self-emission type photosensitive resin composition comprising a photoluminescence quantum dot particle, an alkali-soluble resin, a photopolymerizable compound, a photopolymerization initiator, and a solvent, wherein the light transmission layer is a cured layer of a thermosetting resin composition comprising an alkali-soluble resin, a thermosetting compound and a solvent, or a photocurable resin composition comprising an alkali-soluble resin, a photopolymerizable compound, a photopolymerization initiator, and a solvent, and transmits a light moving between the wavelength conversion layer and the wavelength filter layer and blocks the flow of outgas, and wherein the wavelength filter layer is a cured layer of a colored photosensitive resin composition comprising a coloring agent, an alkali-soluble resin, a photopolymerizable compound, a photopolymerization initiator, and a solvent.

2. The color filter of claim 1, wherein the light transmission layer has a light transmittance of 80% or more.

3. The color filter of claim 1, wherein the light transmission layer is a cured layer of a thermosetting or photocurable resin composition further comprising scattering particles.

4. The color filter of claim 1, wherein the wavelength filter layer is a cured layer of a yellow or red photosensitive resin composition.

5. An image display device having the color filter according to claim 1.

6. An image display device having the color filter according to claim 2.

7. An image display device having the color filter according to claim 3.

8. An image display device having the color filter according to claim 4.

* * * * *